United States Patent [19]
Yang et al.

[11] Patent Number: 5,852,573
[45] Date of Patent: Dec. 22, 1998

[54] POLYLOAD SRAM MEMORY CELL WITH LOW STANBY CURRENT

[75] Inventors: Ching-Nan Yang, Chutung Chen; Li-Chun Peng, Chung Ho, both of Taiwan

[73] Assignee: Mosel Vitelic Inc., Hsinchu, Taiwan

[21] Appl. No.: 946,827

[22] Filed: Oct. 8, 1997

[51] Int. Cl.[6] .................................................. G11C 11/00
[52] U.S. Cl. ............................ 365/154; 365/148; 365/161
[58] Field of Search ...................................... 365/154, 148, 365/161, 174, 87

[56] References Cited

U.S. PATENT DOCUMENTS

| | | | |
|---|---|---|---|
| 4,841,481 | 6/1989 | Ikeda et al. | 365/154 |
| 5,254,870 | 10/1993 | Kimura | 365/154 |
| 5,400,277 | 3/1995 | Nowak | 365/154 |
| 5,745,404 | 4/1998 | Lien et al. | 365/154 |

*Primary Examiner*—David Nelms
*Assistant Examiner*—David Lam
*Attorney, Agent, or Firm*—Harness, Dickey & Pierce, P.L.C.

[57] ABSTRACT

An SRAM cell formed on a semiconductor substrate with low standby current is disclosed. The memory cell includes a first inverter, a second inverter cross-coupled to the first inverter to form a storage element, a first load device coupled to the first inverter, a second load device coupled to the second inverter, a first access transistor coupled to an output port of the first inverter, and a second access transistor coupled to an output port of the second inverter. In this memory cell, the first load device is placed over the second inverter with substantial overlapping therebetween, so that resistance of the first load device increases when an input of the second inverter is at a low potential, thereby decreasing a standby current of the first load device. Similarly, the resistance of the second load device increases when an input of the first inverter is at a low potential.

19 Claims, 5 Drawing Sheets

POLYLOAD SRAM MEMORY CELL WITH LOW STANBY CURRENT

BACKGROUND OF THE INVENTION

1. Field of the Invention

The present invention relates to a static random access memory (SRAM), and particularly to a polyload SRAM cell with low standby current.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a static random access memory (SRAM), which is referred to as a static memory because it does not require periodic refresh operation in order to retain its stored data. The data in an SRAM is stored in a pair of cross-coupled inverters, or a flip-flop. The voltage on one of the two outputs is stable at a high potential, and the other at a low potential. SRAM cells can be implemented in N-type metal-oxide semiconductor (NMOS), complementary metal-oxide semiconductor (CMOS), bipolar, or BiCMOS technologies. FIG. 2 shows a circuit schematic of a six-transistor SRAM cell implemented in CMOS technology, wherein transistors M3 and M4 are used as access transistors, transistors M1 and M2 are used as drive (or pull-down) transistors, and transistors M5 and M6 are used as loads.

In order to increase circuit density and decrease power consumption, a four-transistor SRAM cell structure is disclosed. FIG. 3A shows a circuit schematic of a four-transistor (or polyload) SRAM cell. Load devices R1 and R2 are polysilicon resistors with high-valued resistance. Access transistors Q1 and Q2 are NMOS devices whose states are controlled by wordline WL. Data are read out or written into the cross-coupled inverter Q3 and Q4, the main storage element, and to or from bitlines BL1, BL2 through the access transistors Q1, Q2.

A simplified layout diagram corresponding to FIG. 3A is depicted in FIG. 3B. Buried contacts 30 are typically used as local interconnect at nodes N2 and N1 to connect the doped polysilicon gate electrode of the transistors Q3 and Q4 to the source/drain of the access transistors Q2 and Q1. Polysilicon regions R1 and R2 are used as the load devices. In order to minimize power consumption and yet maintain its proper function, the load current of the memory cell is, for example, set to about 31 pA. Therefore, polysilicon loads with very high-valued resistance are required. Unfortunately, while the resistance increases, retention of data at the output of the drive transistor (Q4 or Q3) becomes worse when at a low potential, nevertheless resulting in low standby current flowing in the corresponding polysilicon load. On the other hand, while the resistance decreases, retention of data improves, however, at a cost of increase in standby current. Usually, sheet resistance of tens to hundreds giga ohms per square (GΩ/sq) is chosen to reach a compromise.

SUMMARY OF THE INVENTION

In accordance with the present invention, an SRAM cell formed on a semiconductor substrate is provided that substantially reduces standby current. In one embodiment, the memory cell includes a first pull-down transistor, and a second pull-down transistor cross-coupled to the first pull-down transistor to form a storage element. Further, a first polysilicon resistor is coupled to the first pull-down transistor to pull-up the first pull-down transistor to a power source, and a second polysilicon resistor is coupled to the second pull-down transistor to pull-up the second pull-down transistor to the power source. The memory cell also includes a first access transistor coupled to an output port of the first pull-down transistor, so that stored data in the storage element is selectively communicated to a first bitline via the first access transistor, the selective communication through the first access transistor being controlled by a wordline, and a second access transistor coupled to an output port of the second pull-down transistor, so that stored data in the storage element is selectively communicated to a second bitline via the second access transistor, the selective communication through the second access transistor being controlled by the wordline.

In the memory cell, the first polysilicon resistor is placed over the second pull-down transistor with substantial overlapping therebetween. When the gate of the second pull-down transistor is at low potential, the electrons of the first polysilicon resistor are attracted, and the electrons flowing towards the power source decrease due to the depletion generated by the electric field exerted thereon, thereby increasing the resistance of the first polysilicon resistor. Consequently, a low standby current flows in the first polysilicon resistor. Further, the second polysilicon resistor is placed over the first pull-down transistor with substantial overlapping therebetween. When the gate of the first pull-down transistor is at low potential, the electrons of the second polysilicon resistor are attracted, and the electrons flowing towards the power source decrease due to the depletion generated by the electric field exerted thereon, thereby increasing the resistance of the second polysilicon resistor. Consequently, a low standby current flows in the second polysilicon resistor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
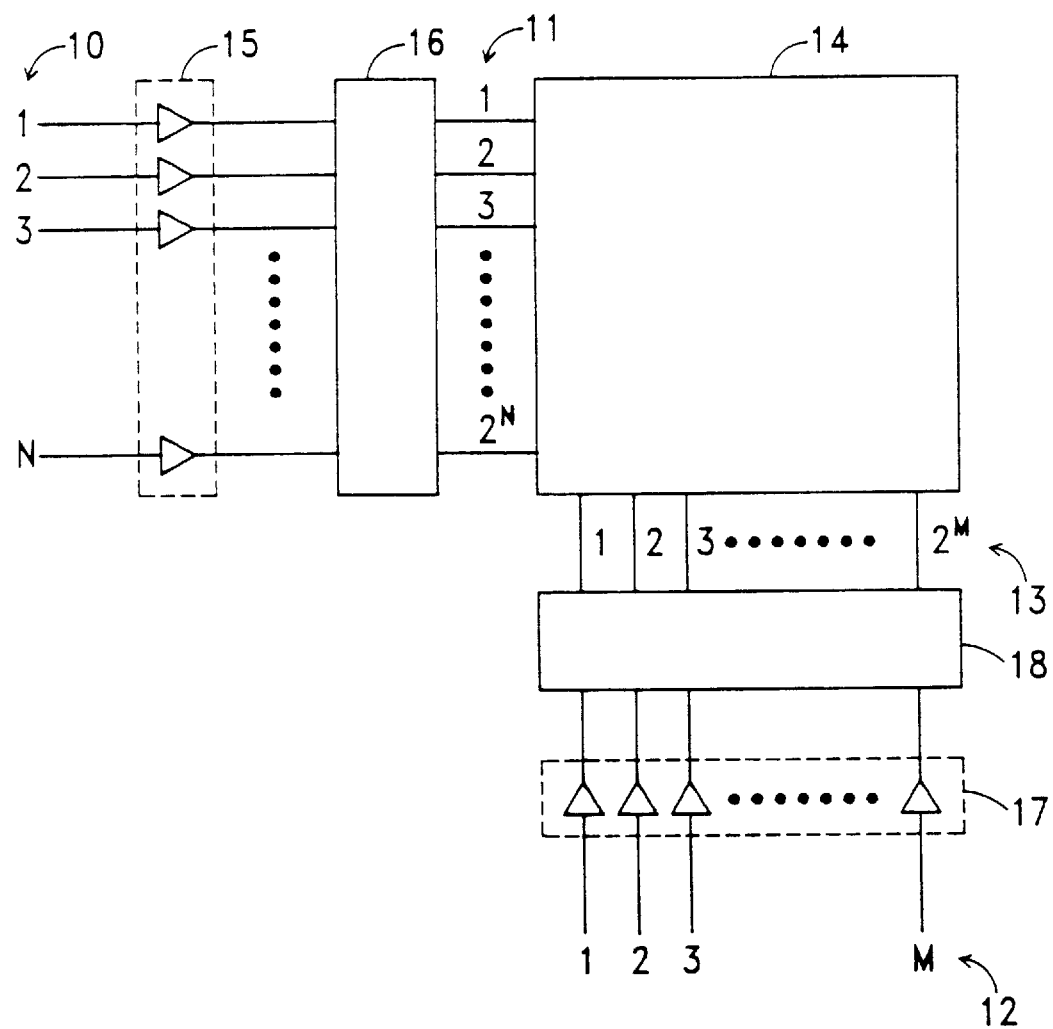
FIG. 1 shows a simplified diagram illustrative of the organization of a typical large semiconductor memory.
Figure 2:
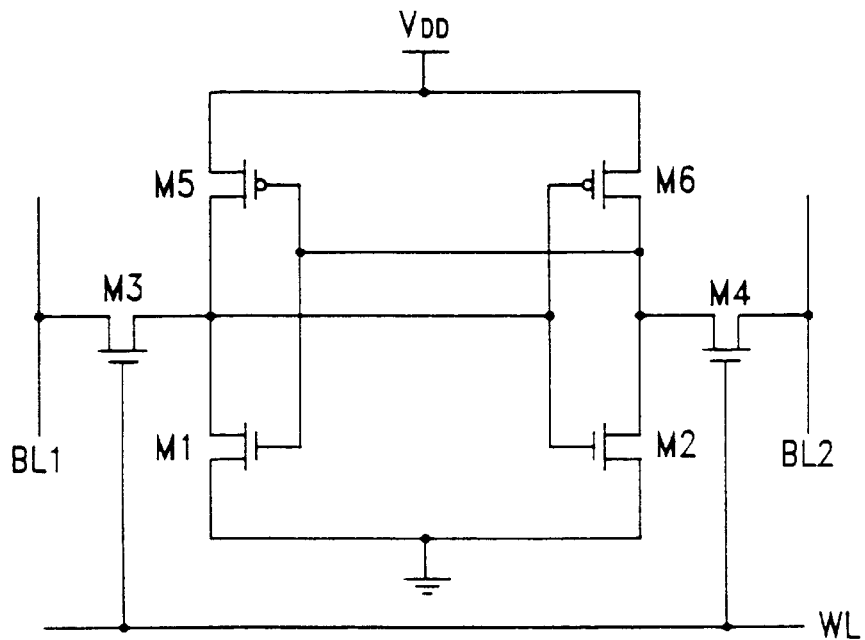
FIG. 2 shows a circuit schematic of a conventional six-transistor SRAM cell implemented in CMOS technology.
Figure 3A:
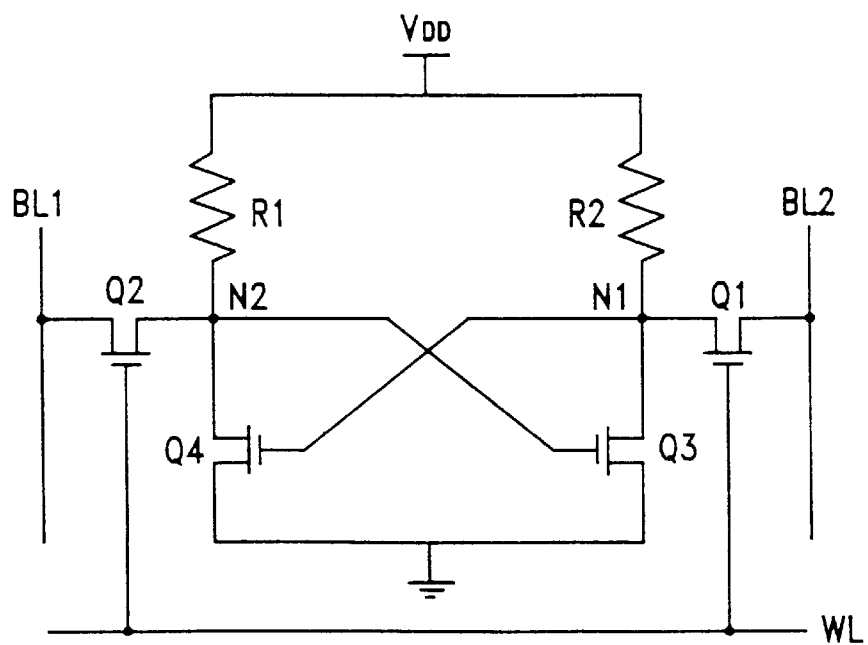
FIG. 3A shows a circuit schematic of a conventional four-transistor (or polyload) SRAM cell.
Figure 3B:
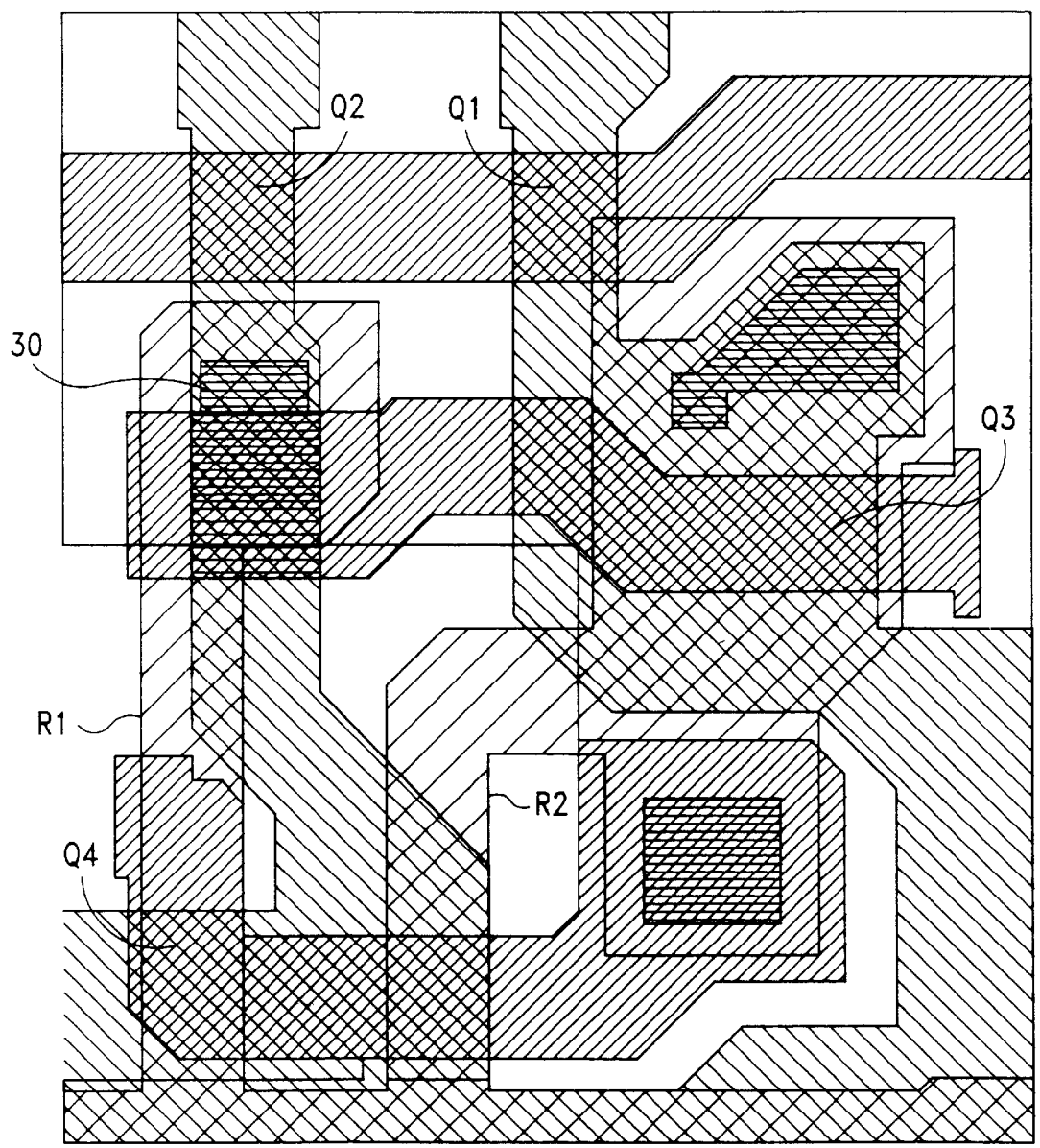
FIG. 3B depicts a simplified layout diagram corresponding to FIG. 3A.
Figure 4A:
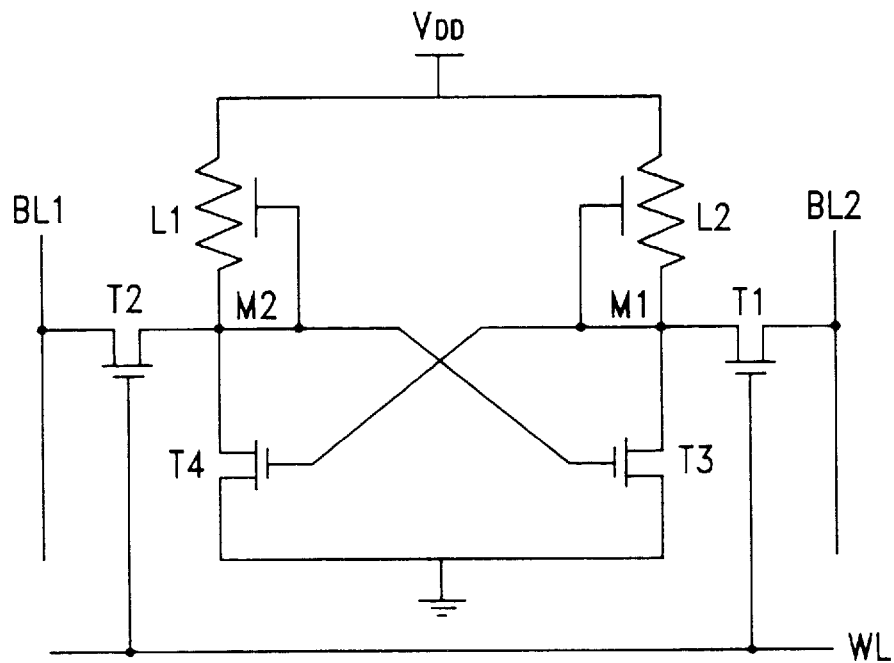
FIG. 4A shows a circuit schematic of a four-transistor (or polyload) SRAM cell according to one embodiment of the present invention.

FIG. 4A shows a circuit schematic of a four-transistor (or polyload) SRAM cell according to one embodiment of the present invention. Access transistors T1 and T2 are NMOS devices whose states are controlled by wordline WL. Data are read out or written into the cross-coupled inverter T3 and T4, the main storage element, and to or from bitlines BL1, BL2 through the access transistors T1, T2. Load devices L1 and L2 are polysilicon resistors whose resistance is controlled by the output of the inverter (or drive transistor). For example, when the output of the drive transistor T4 at node M2 is at low potential, the resistance increases, resulting in low standby current flowing in the load L1. At the same time, the resistance of another load L2 is not affected by the output voltage at node M1, thereby retaining the retention of data at node M1.

Specifically, the memory cell according to the present invention includes a first pull-down transistor T4, and a second pull-down transistor T3 which is cross-coupled to the first pull-down transistor T4 to form a storage element (or a latch circuit). Further, a first polysilicon resistor L1 is coupled to the first pull-down transistor T4 to pull-up the first pull-down transistor T4 to a power source $V_{DD}$, and a second polysilicon resistor L2 is coupled to the second pull-down transistor T3 to pull-up the second pull-down transistor T3 to the power source $V_{DD}$. The memory cell also includes a first access transistor T2 coupled to an output port of the first pull-down transistor T4 at node M2, so that stored data in the storage element T3 and T4 is selectively communicated to a first bitline BL1 via the first access transistor T2, wherein the selective communication through the first access transistor is controlled by a wordline WL. A second access transistor T1 is coupled to an output port of the second pull-down transistor T3 at node M1, so that stored data in the storage element is selectively communicated to a second bitline BL2 via the second access transistor T1, wherein the selective communication through the second access transistor T1 is controlled by the wordline WL.

Figure 4B:
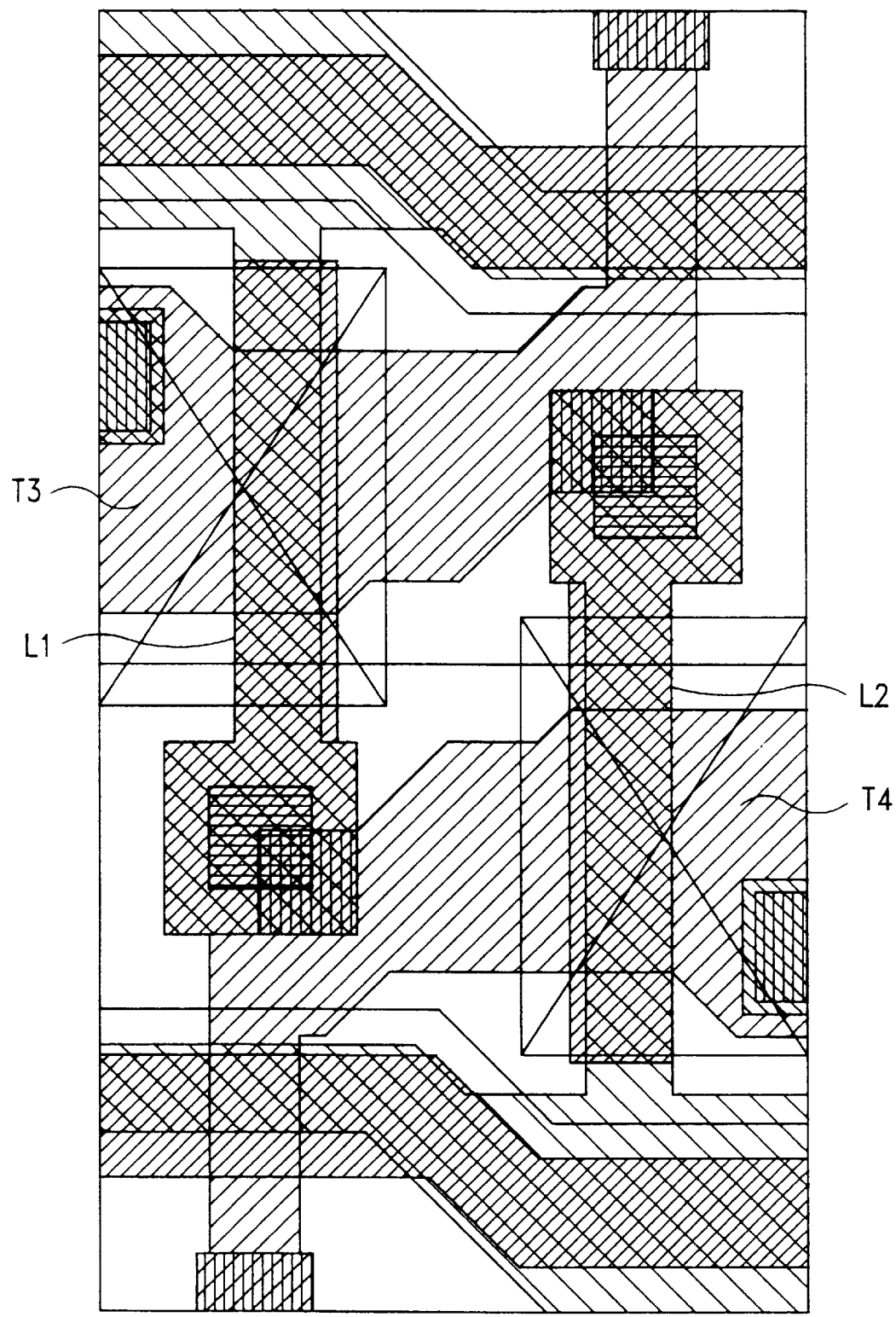
FIG. 4B depicts a simplified layout diagram corresponding to FIG. 4A according to the embodiment of the present invention.

A simplified layout diagram corresponding to FIG. 4A according to the embodiment of the present invention is depicted in FIG. 4B. In order to achieve the controllability of the load devices L1 and L2 described above, the polysilicon region of the polyload L1 is placed over the doped polysilicon gate layer of the drive transistor T3 with substantial overlapping therebetween, and the polyload L2 is placed over the doped polysilicon gate layer of the drive transistor T4 with substantial overlapping therebetween according to one embodiment of the present invention. When the output of the drive transistor T4 at node M2 is at low potential, the electrons of the polyload L1 are attracted, and the electrons flowing towards the power source $V_{DD}$ decrease due to the depletion generated by the electric field exerted thereon, thereby increasing the resistance of the polyload L1. Consequently, a low standby current flows in the load L1. At the same time, the resistance of another load L2 is not affected by the output voltage at node M1, thereby retaining the retention of data at node M1.

Figure 5:
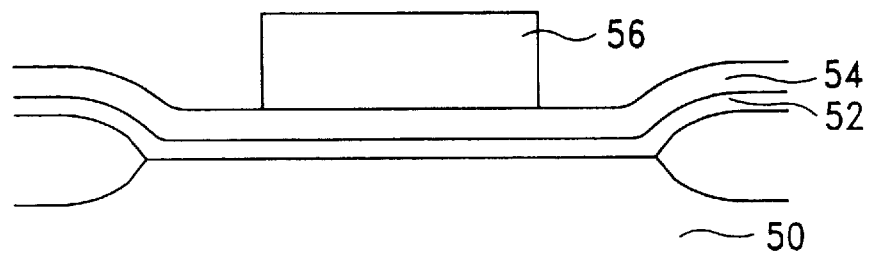
FIG. 5 illustrates a cross-sectional view in a portion of FIG. 4B.

FIG. 5 illustrates a cross-sectional view in a portion of FIG. 4B. In this figure, the doped polysilicon layer 52 of a drive transistor (T4 or T3) is formed on a semiconductor substrate 50. The polyload (L1 or L2) layer 56 is placed over the doped polysilicon layer 52 of a drive transistor (T4 or T3) with substantial overlapping therebetween. Further, a dielectric layer 54 such as interpoly is formed between the doped polysilicon layer 52 and the polyload layer 56. In this embodiment, a polysilicon load with a sheet resistance of about tens of GΩ/sq not under electric field is preferably used. This sheet resistance can be obtained with As implant.

Although specific embodiments have been illustrated and described, it will be obvious to those skilled in the art that various modifications may be made without departing from the spirit which is intended to be limited solely by the appended claims.

What is claimed is:

1. A static random access memory cell formed on a semiconductor substrate, said memory cell comprising:

a first inverter;

a second inverter cross-coupled to said first inverter to form a storage element;

a first load device, coupled to said first inverter, for pulling-up said first inverter to a power source;

a second load device, coupled to said second inverter, for pulling-up said second inverter to the power source;

a first access transistor coupled to an output port of said first inverter, so that stored data in the storage element is selectively communicated to a first bitline via said first access transistor, said selective communication through said first access transistor being controlled by a wordline; and a second access transistor coupled to an output port of said second inverter, so that stored data in the storage element is selectively communicated to a second bitline via said second access transistor, said selective communication through said second access transistor being controlled by the wordline, wherein said first load device is placed over said second inverter with substantial overlapping therebetween, when an input of said second inverter is at a low potential, a depletion region is generated between overlapped said first load device and said second inverter, obstructing movement of electrons in said first load device, thereby increasing resistance of said first load device and decreasing a standby current of said first load device, and said second load device is placed over said first inverter with substantial overlapping therebetween, when an input of said first inverter is at a low potential, a depletion region is generated between overlapped said second load device and said first inverter, obstructing movement of electrons in said second load device, thereby increasing resistance of said second load device and decreasing a standby current of said second load device.

2. The memory cell according to claim 1, wherein said first inverter comprises an NMOS transistor.

3. The memory cell according to claim 1, wherein said second inverter comprises an NMOS transistor.

4. The memory cell according to claim 1, wherein said first load device comprises a polysilicon resistor.

5. The memory cell according to claim 1, wherein said second load device comprises a polysilicon resistor.

6. The memory cell according to claim 1, wherein said first access transistor comprises an NMOS transistor.

7. The memory cell according to claim 1, wherein said second access transistor comprises an NMOS transistor.

8. A static random access memory cell formed on a semiconductor substrate, said memory cell comprising:

a first inverter;

a second inverter cross-coupled to said first inverter to form a storage element;

a first load device, coupled to said first inverter, for pulling-up said first inverter to a power source;

a second load device, coupled to said second inverter, for pulling-up said second inverter to the power source;

a first access transistor coupled to an output port of said first inverter, so that stored data in the storage element is selectively communicated to a first bitline via said first access transistor, said selective communication through said first access transistor being controlled by a wordline; and a second access transistor coupled to an output port of said second inverter, so that stored data in the storage element is selectively communicated to a second bitline via said second access transistor, said selective communication through said second access transistor being controlled by the wordline, wherein said first load device is placed over said second inverter with substantial overlapping therebetween, and said second load device is placed over said first inverter with substantial overlapping therebetween, and said first load device being isolated from said second inverter only by dielectric material, and said second load device being isolated from said first inverter only by dielectric material.

9. The memory cell according to claim 8, wherein said first inverter comprises an NMOS transistor.

10. The memory cell according to claim 8, wherein said second inverter comprises an NMOS transistor.

11. The memory cell according to claim 8, wherein said first load device comprises a polysilicon resistor.

12. The memory cell according to claim 8, wherein said second load device comprises a polysilicon resistor.

13. The memory cell according to claim 8, wherein said first access transistor comprises an NMOS transistor.

14. The memory cell according to claim 8, wherein said second access transistor comprises an NMOS transistor.

15. A static random access memory cell formed on a semiconductor substrate, said memory cell comprising:

a first pull-down transistor;

a second pull-down transistor cross-coupled to said first pull-down transistor to form a storage element;

a first polysilicon resistor, coupled to said first pull-down transistor, for pulling-up said first pull-down transistor to a power source;

a second polysilicon resistor, coupled to said second pull-down transistor, for pulling-up said second pull-down transistor to the power source;

a first access transistor coupled to an output port of said first pull-down transistor, so that stored data in the storage element is selectively communicated to a first bitline via said first access transistor, said selective communication through said first access transistor being controlled by a wordline; and a second access transistor coupled to an output port of said second pull-down transistor, so that stored data in the storage element is selectively communicated to a second bitline via said second access transistor, said selective communication through said second access transistor being controlled by the wordline, wherein said first polysilicon resistor is placed over a gate of said second pull-down transistor with substantial overlapping therebetween, when the gate of said second pull-down transistor is at a low potential, a depletion region is generated between overlapped said first polysilicon resistor and said second pull-down transistor, obstructing movement of electrons in said first polysilicon resistor, thereby increasing resistance of said first polysilicon resistor and decreasing a standby current of said first polysilicon resistor, and said second polysilicon resistor is placed over said first pull-down transistor with substantial overlapping therebetween, when the gate of said first pull-down transistor is at a low potential, a depletion region is generated between overlapped said second polysilicon resistor and said first pull-down transistor, obstructing movement of electrons in said second polysilicon resistor thereby increasing resistance of said second polysilicon resistor and decreasing a standby current of said second polysilicon resistor.

16. The memory cell according to claim 15, wherein said first pull-down transistor comprises an NMOS transistor.

17. The memory cell according to claim 15, wherein said second pull-down transistor comprises an NMOS transistor.

18. The memory cell according to claim 15, wherein said first access transistor comprises an NMOS transistor.

19. The memory cell according to claim 15, wherein said second access transistor comprises an NMOS transistor.

* * * * *